United States Patent
Kobayashi et al.

(10) Patent No.: US 9,466,515 B2
(45) Date of Patent: Oct. 11, 2016

(54) HEAT TREATMENT FURNACE AND HEAT TREATMENT APPARATUS

(75) Inventors: Makoto Kobayashi, Oshu (JP); Kenichi Yamaga, Oshu (JP); Akira Sasaki, Tokyo (JP); Daisuke Ikeda, Tokyo (JP); Takahiro Koike, Tokyo (JP)

(73) Assignees: NICHIAS CORPORATION, Tokyo (JP); TOKYO ELECTRON LIMITED, Tokyo (JP)

( * ) Notice: Subject to any disclaimer, the term of this patent is extended or adjusted under 35 U.S.C. 154(b) by 771 days.

(21) Appl. No.: 13/527,150

(22) Filed: Jun. 19, 2012

(65) Prior Publication Data

US 2012/0329002 A1 Dec. 27, 2012

(30) Foreign Application Priority Data

Jun. 21, 2011 (JP) ................... 2011-137428

(51) Int. Cl.
| | |
|---|---|
| B01J 3/04 | (2006.01) |
| H05B 3/68 | (2006.01) |
| F27B 17/00 | (2006.01) |
| C23C 16/46 | (2006.01) |
| F27D 1/00 | (2006.01) |
| H01L 21/67 | (2006.01) |

(52) U.S. Cl.
CPC .............................. H01L 21/67109 (2013.01)

(58) Field of Classification Search
None
See application file for complete search history.

(56) References Cited

U.S. PATENT DOCUMENTS

| | | | | |
|---|---|---|---|---|
| 2,035,306 | A | * | 3/1936 | Fannin ........................ 373/130 |
| 2,477,796 | A | * | 8/1949 | Germany ............... C21D 1/767 165/61 |
| 4,849,608 | A | * | 7/1989 | Muraoka et al. ............ 219/390 |
| 5,128,515 | A | * | 7/1992 | Tanaka ......................... 219/390 |
| 5,171,972 | A | * | 12/1992 | Hidano ........................ 219/390 |
| 5,187,771 | A | * | 2/1993 | Uchida ........................ 392/416 |
| 5,229,576 | A | * | 7/1993 | Nakao et al. ................ 219/390 |
| 5,506,389 | A | * | 4/1996 | Hidano et al. ............... 219/390 |
| 5,536,919 | A | * | 7/1996 | Taheri ......................... 219/402 |

(Continued)

FOREIGN PATENT DOCUMENTS

| | | |
|---|---|---|
| JP | 4-101419 A | 4/1992 |
| JP | 2004-324971 A | 11/2004 |

(Continued)

*Primary Examiner* — Gregory Huson
*Assistant Examiner* — Eric Gorman
(74) *Attorney, Agent, or Firm* — Nath, Goldberg & Meyer; Jerald L. Meyer; Christopher Thomas (57) ABSTRACT

A heat treatment furnace includes: a processing vessel configured to accommodate therein at least one object to be processed; a cylindrical heat insulating member covering a periphery of the processing vessel; and a heater disposed along an inner circumferential surface of the heat insulating member. The heater includes strip-shaped corrugated heater elements disposed along the inner circumferential surface of the heat insulating member, each of the heater elements having valley portions protruding outward and mountain portions protruding inward.

2 Claims, 7 Drawing Sheets

(56) References Cited

U.S. PATENT DOCUMENTS

| | | | |
|---|---|---|---|
| 6,005,225 A * | 12/1999 | Kowalski et al. | 219/390 |
| 6,008,477 A * | 12/1999 | Nakao | H01L 21/67109 219/390 |
| 6,125,134 A * | 9/2000 | Jonsson et al. | 373/128 |
| 6,427,462 B1 * | 8/2002 | Suenaga | H01L 21/67109 165/169 |
| 7,595,465 B2 * | 9/2009 | Kolk | 219/402 |
| 8,121,799 B2 * | 2/2012 | Terasawa et al. | 702/34 |
| 8,476,560 B2 * | 7/2013 | Kobayashi | F27B 17/0025 219/390 |
| 2001/0010307 A1 * | 8/2001 | Saito et al. | 219/390 |
| 2006/0022387 A1 * | 2/2006 | Ueno | F27B 14/08 266/104 |
| 2007/0148607 A1 * | 6/2007 | Tani | 432/241 |
| 2008/0073334 A1 * | 3/2008 | Nakao et al. | 219/385 |
| 2008/0086228 A1 * | 4/2008 | Yamaji et al. | 700/109 |
| 2008/0205864 A1 * | 8/2008 | Kobayashi et al. | 392/416 |
| 2008/0232787 A1 * | 9/2008 | Ichikawa et al. | 392/416 |
| 2008/0296282 A1 * | 12/2008 | Kobayashi et al. | 219/385 |
| 2009/0194521 A1 * | 8/2009 | Kobayashi et al. | 219/520 |
| 2010/0147161 A1 * | 6/2010 | Onozato | A21B 1/245 99/483 |
| 2011/0021038 A1 * | 1/2011 | Murata | H01L 21/324 438/795 |
| 2011/0021039 A1 * | 1/2011 | Murata | H01L 21/67109 438/795 |
| 2012/0037613 A1 * | 2/2012 | Ohtake | 219/546 |
| 2012/0061377 A1 * | 3/2012 | Agamohamadi et al. | 219/468.1 |
| 2014/0103024 A1 * | 4/2014 | Kobayashi | F27B 17/0025 219/402 |
| 2014/0322926 A1 * | 10/2014 | Murata | H01L 21/324 438/795 |
| 2015/0201468 A1 * | 7/2015 | Yonenaga | H05B 6/105 219/634 |

FOREIGN PATENT DOCUMENTS

| | | |
|---|---|---|
| JP | 2008-218478 A | 9/2008 |
| JP | 2008-263170 A | 10/2008 |

* cited by examiner

HEAT TREATMENT FURNACE AND HEAT TREATMENT APPARATUS

CROSS-REFERENCE TO RELATED APPLICATION(S)

This application claims the benefit of Japanese Patent Application No. 2011-137428, filed on Jun. 21, 2011, in the Japanese Patent Office, the disclosure of which is incorporated herein in its entirety by reference.

TECHNICAL FIELD

The present disclosure relates to a heat treatment furnace and a heat treatment apparatus having the same.

BACKGROUND

In manufacturing semiconductor devices, a variety of heat treatment apparatuses are being used to perform treatments, e.g., oxidation, diffusion, and CVD (Chemical Vapor Deposition), on target semiconductor wafers. In general, a heat treatment apparatus includes a processing vessel configured to accommodate therein a semiconductor wafer, a cylindrical heat insulating member covering the periphery of the processing vessel, and a heat treatment furnace having a heater provided at the inner circumferential surface of the heat insulating member to heat the semiconductor wafer accommodated in the processing vessel.

For a heater for use in a batch type heat treatment apparatus, for example, there are used heater elements which are supported by supports disposed along the inner wall of a cylindrical heat insulating member and heat the inside of a furnace to be in a range from about 800 degree C. to about 1000 degree C. Further, the heat insulating member is made by baking insulation material, for example, made of ceramic fiber, into a cylindrical shape, and thus heat loss due to radiation or conduction of heat can be reduced and efficient heating can be made. Furthermore, the supports are made of, for example, ceramic, and support the heater elements with a predetermined pitch so as to allow thermal expansion or contraction of the heater elements.

Meanwhile, the heater elements are provided at the inner circumferential surface of the cylindrical heat insulating member in such a manner that one heater element is provided at each half circumferential surface when the inner circumferential surface of the heat insulating member is vertically divided into two half circumferential surfaces. In this case, a first and a second heater element respectively provided at a first and a second half circumferential surface operate independently.

Further, each of the heater elements has a plurality of columnar portions, each columnar portion extending in a circumferential direction and provided in multi-stages, and a connecting member extending in a vertical direction and connecting the columnar portions.

However, it is difficult to provide conventional heater elements having the above-described configuration at the entire inner circumferential surface of the heat insulating member, and it is also difficult to heat semiconductor wafers uniformly with such conventional heater elements.

SUMMARY

The present disclosure provides a heat treatment furnace and a heat treatment apparatus using the same, in which heater elements are disposed over the entire inner circumferential surface of a heat insulating member so that a wafer can be heated uniformly and stress concentration on the heater elements can be prevented.

According to one aspect of the present disclosure, there is provided a heat treatment furnace including: a processing vessel configured to accommodate therein at least one object to be processed; a cylindrical heat insulating member covering a periphery of the processing vessel; and a heater disposed along an inner circumferential surface of the heat insulating member, wherein the heater includes strip-shaped corrugated heater elements disposed along the inner circumferential surface of the heat insulating member, each of the heater elements having valley portions protruding outward and mountain portions protruding inward.

According to another aspect of the present disclosure, there is provided a heat treatment apparatus, including: a heat treatment furnace having a processing vessel configured to accommodate therein one or more objects to be processed, a lower end of the heat treatment furnace being open to form a vessel opening; a lid configured to open or close the vessel opening; a holding unit loaded on the lid and configured to mount therein the objects to be processed in multi-stages; and an elevation mechanism configured to vertically move the holding unit and the lid to open or close the vessel opening and to load or unload the holding unit into or from the processing vessel. The heat treatment furnace includes: a cylindrical heat insulating member covering a periphery of the processing vessel; and a heater disposed along an inner circumferential surface of the heat insulating member, wherein the heater includes strip-shaped corrugated heater elements disposed along the inner circumferential surface of the heat insulating member, each of the heater elements having valley portions protruding outward and mountain portions protruding inward.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Hereinafter, embodiment(s) of the present disclosure will be described in detail with reference to the drawings. FIG.

Figure 2:
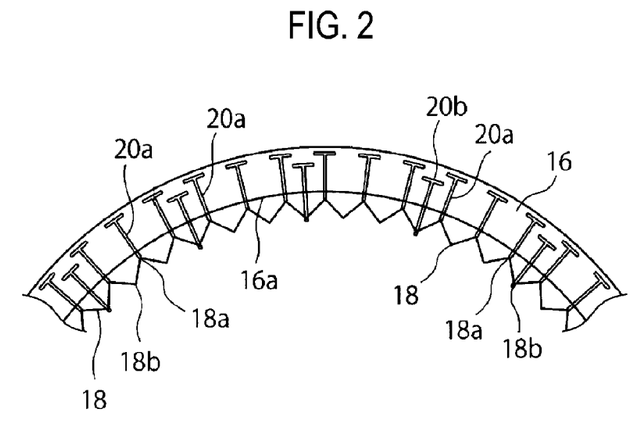
FIG. 2 illustrates an enlarged transversal cross sectional view of a heat insulating member and a heater element.
Figure 3A:
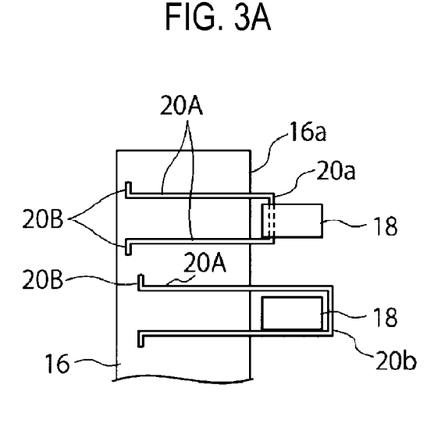
FIG. 3A illustrates an enlarged transversal cross sectional view of a heat insulating member and a heater element.
Figure 3B:
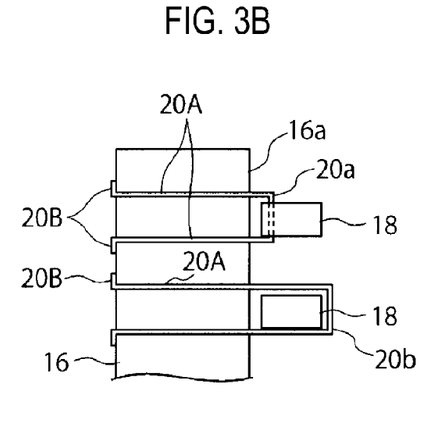
FIG. 3B illustrates an enlarged transversal cross sectional view of a modification thereof
Figure 4:
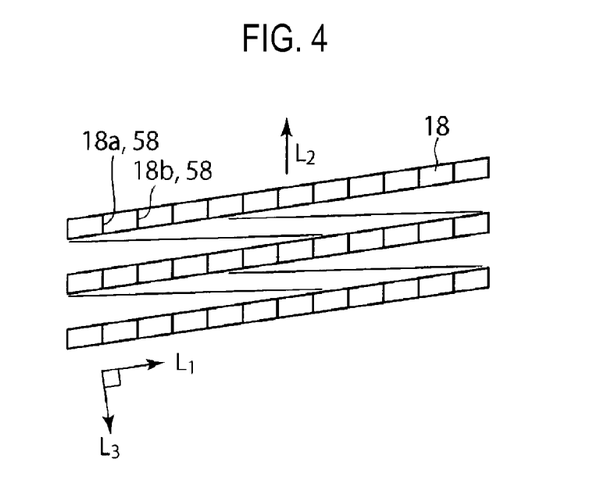
FIG. 4 illustrates an installed state of a heater element.
Figure 5:
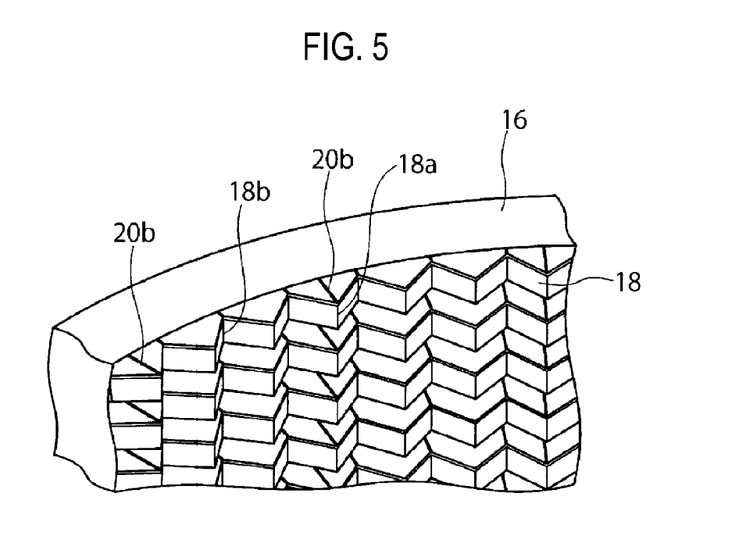
FIG. 5 illustrates a perspective view of a heater element installed at the inner circumferential surface of a heat insulating member.

1 illustrates a schematic longitudinal cross sectional view of a heat treatment apparatus in accordance with an embodiment of the present disclosure. FIG. 2 illustrates an enlarged transversal cross sectional view of a heat insulating member and a heater element. FIGS. 3A illustrates an enlarged transversal cross sectional view of a heat insulating member and a heater element, and FIG. 3B illustrates an enlarged transversal cross sectional view of a modification thereof FIG. 4 illustrates an installed state of a heater element. FIG. 5 illustrates a perspective view of a heater element installed at the inner circumferential surface of a heat insulating member.

Figure 1:
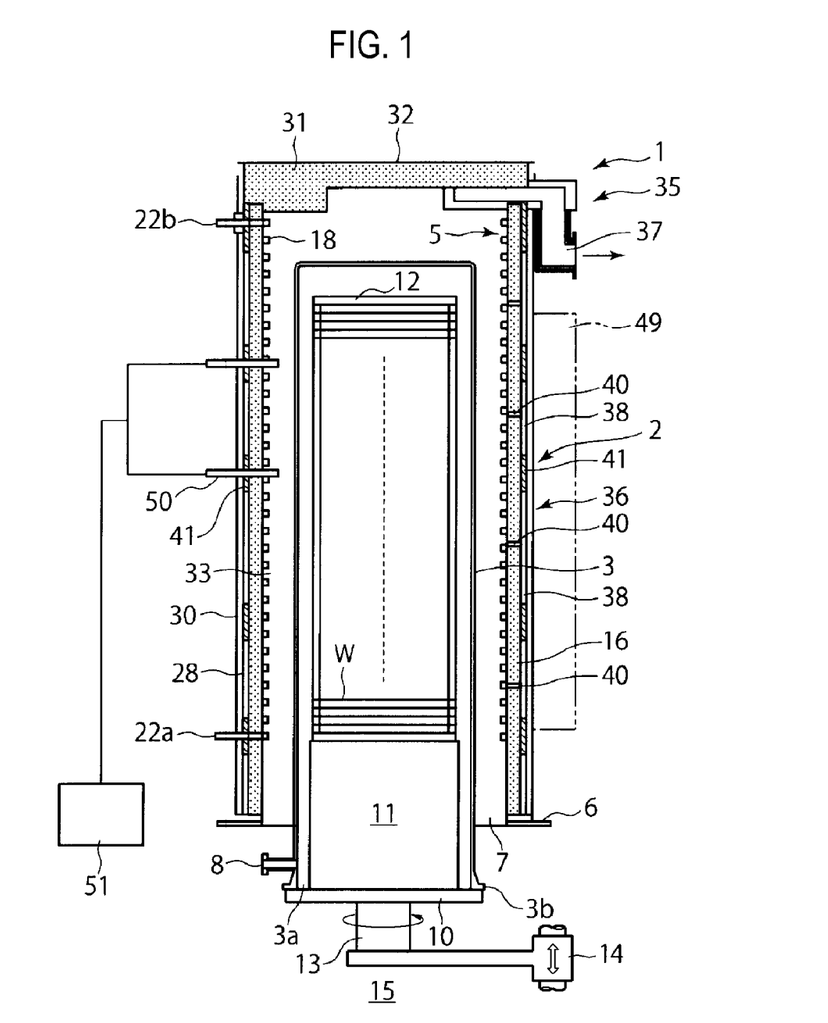
FIG. 1 illustrates a schematic longitudinal cross sectional view of a heat treatment apparatus in accordance with an embodiment of the present disclosure.

Reference numeral 1 in FIG. 1 denotes a vertical heat treatment apparatus, which is one of the semiconductor manufacturing apparatuses. The heat treatment apparatus 1 includes a vertical heat treatment furnace 2 configured to accommodate therein a plurality of objects to be processed, e.g., semiconductor wafers W, at a time and perform heat treatments, e.g., oxidation, diffusion, and low pressure CVD, on the plurality of objects. The heat treatment furnace 2 includes a cylindrical processing vessel 3 configured to accommodate therein the wafers W, a cylindrical heat insulating member 16 covering the periphery of the processing vessel 3, and a heater 5 provided along the inner circumferential surface 16a of the heat insulating member 16.

The heat treatment apparatus 1 further includes a base plate 6 on which the heat insulating member 16 is provided. In the base plate 6, an opening 7 into which the processing vessel 3 is inserted from a lower side to an upper side is formed. In the opening 7, a heat insulating member (not shown) is provided to cover a gap between the base plate 6 and the processing vessel 3.

The processing vessel 3 is made of quartz, and shaped as a vertically long cylinder in which an upper end is closed and a lower end is open to form a vessel opening 3a. At the open end of the processing vessel 3, an outwardly extending flange 3b is formed, and the flange 3b is supported by the base plate 6 via a flange pressing member (not shown). At a lower part of the processing vessel 3 shown in FIG. 1, an inlet port (inlet opening) 8 configured to introduce therethrough a processing gas or an inert gas into the processing vessel 3, and a gas exhaust port (gas exhaust opening) (not shown) configured to exhaust therethrough gases in the processing vessel 3 are provided. The inlet port 8 is connected to a gas supply, and the gas exhaust port is connected to a gas exhaust system having a vacuum pump capable of depressurizing the inner pressure of the processing vessel 3 to be in a range, e.g., from about 10 Torr to about $10^{-8}$ Torr.

At the underside of the processing vessel 3, a lid 10 configured to move up/down to open/close the open lower end of the processing vessel 3, i.e., the vessel opening 3a, is provided. The lid 10 is vertically movable by an elevation mechanism 14. On an upper portion of the lid 10, a means for thermally-insulating the vessel opening 3a, e.g., a thermal insulation container 11, is loaded, and a boat 12, which is a holding unit configured to mount therein a plurality, e.g., about 100-150 sheets, of the wafers W at specific vertical intervals therebetween, is loaded on an upper portion of the lid 10. The diameter of each of the wafers W may be, e.g., 300 mm. At the lid 10, a rotation mechanism 13, which rotates the boat 12 around the center of an axis thereof, is provided. The boat 12 is unloaded from the processing vessel 3 into a loading area 15 disposed at the underside of the processing vessel 3 by a downward movement of the lid 10, and after mounting the wafers W therein, the boat 12 loaded into the processing vessel 3 by an upward movement of the lid 10.

As shown in FIGS. 2 to 5, the heater 5 includes strip-shaped heater elements 18 spirally disposed along the inner circumferential surface 16a of the cylindrical heat insulating member 16, and each of the strip-shaped heater elements 18 is made of corrugated material having valley portions 18a protruding outward (toward the inner circumferential surface 16a of the cylindrical heat insulating member 16) and mountain portions 18b protruding inward (toward the center portion of the processing vessel 3). Each top end portion of both the valley portions 18a and the mountain portions 18b of the heater elements 18 is made by a bent line 58. The bent line 58 is inclined with respect to a widthwise direction $L_3$ (a direction perpendicular to a lengthwise direction $L_1$) of the heater elements 18 and coincides with an axial direction $L_2$ of the heat insulating member 16. The heat insulating member 16 is made of an inorganic fiber including, e.g., silica, alumina or silica-alumina.

The heater elements 18 are made by a bending machining process, i.e., a process of forming a base material of the heater elements 18 into a bent waveform by using the bent lines 58 described above. The base material of the heater elements 18 is made of, e.g., an alloy of Fe, Cr, and Al; and, for example, each of the heater elements 18 has a thickness of about 1 mm to about 2 mm, a width of about 14 mm to about 18 mm, an amplitude of the waveform of about 11 mm to about 15 mm, and a pitch of the waveform of about 28 mm to about 32 mm. Further, each vertical angle of the valley portions 18a and the mountain portions 18b is about 90 degree, and an R-bending is carried out on each top end portion of the valley portions 18a and the mountain portions 18b.

The inner circumferential surface 16a of the heat insulating member 16 is smoothed and provided with release prevention valley portion support pins 20a and collapse prevention mountain portion support pins 20b. The release prevention valley portion support pins 20a support the valley portions 18a of the heater elements 18 at predetermined intervals therebetween in such a manner that the valley portions 18a can move in the radial direction while being prevented from being released and falling into the inside of the heat insulating member 16. The collapse prevention mountain portion support pins 20b support the mountain portions 18b of the heater elements 18 to prevent the mountain portions 18b from collapsing. The release prevention valley portion support pins 20a and the collapse prevention mountain portion support pins 20b are partially buried in the heat insulating member.

Between the inner circumferential surface 16a of the heat insulating member 16 and heater elements 18, a gap allowing thermal expansions/contractions and radial movements of the heater elements 18 is formed. Further, when forcibly cooling the heater elements 18, the gap allows a coolant to enter the rear sides of the heater elements 18, thereby cooling the heater elements 18 more efficiently.

Each of the valley portion support pins 20a and the mountain portion support pins 20b includes a U-shaped body 20A, and release prevention members 20B formed at both end portions of the U-shaped body 20A and coupled to the heat insulating member 16 to prevent the valley portion support pins 20a and the mountain portion support pins 20b from being released from the heat insulating member 16. The release prevention members 20B may be disposed inside of the heat insulating member 16 and coupled to inner portions of the heat insulating member 16 (see FIG. 3A). Alternatively, the release prevention members 20B may protrude outside of the heat insulating member 16 to be coupled to the outer surface of the heat insulating member 16 (see FIG. 3B).

Both the valley portion support pins 20a and the mountain portion support pins 20b are made of the same material as that of the heater elements 18.

Hereinafter, the shapes of the valley portion support pin 20a and the mountain portion support pin 20b will be described in detail with reference to FIGS. 6A to 6K.

Figure 6A:
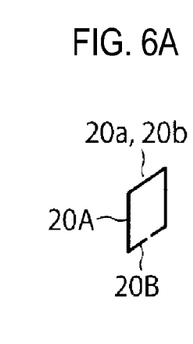
FIGS. 6A to 6K illustrate a valley portion support pin and a mountain portion support pin.

As shown in FIG. 6A, the valley portion support pin 20a and the mountain portion support pin 20b have the same shape, including the U-shaped body 20A and the release prevention members 20B provided at both end portions of the U-shaped body 20A and coupled to the heat insulating member 16. The U-shaped body 20A supports the valley portion 18a or the mountain portion 18b, and the release prevention members 20B are formed to be bent inwardly from both end portions of the U-shaped body 20A.

One valley portion support pin 20a is provided to support each valley portion 18a and prevent the corresponding valley portion 18a from being released, and one mountain portion support pin 20b is provided for each two or three mountain portions 18b to prevent the corresponding mountain portions 18b from collapsing.

Next, modifications of the valley portion support pin 20a and the mountain portion support pin 20b will be described with reference to FIGS. 6B to 6K.

Figure 6B:
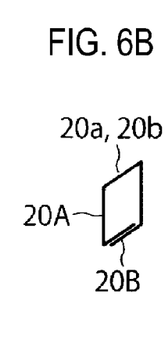

The pair of the release prevention members 20B of the valley portion support pin 20a and the mountain portion support pin 20b may be formed to be bent inwardly from both end portions of the U-shaped body 20A and laid one over the other (see FIG. 6B).

Figure 6C:
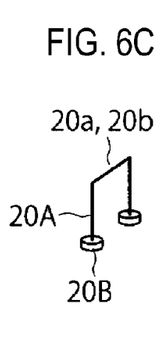
Figure 6D:
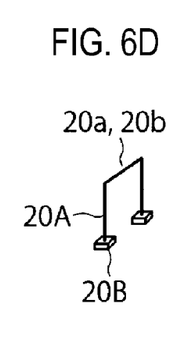

The release prevention members 20B of the valley portion support pin 20a and the mountain portion support pin 20b may be formed by bonding separate components to both end portions of the U-shaped body 20A or by caulking both end portions of the U-shaped body 20A with separate components (see FIGS. 6C and 6D).

Figure 6E:
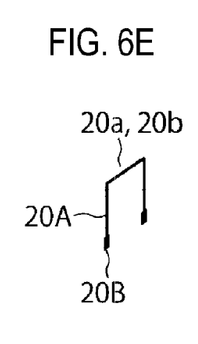
Figure 6F:
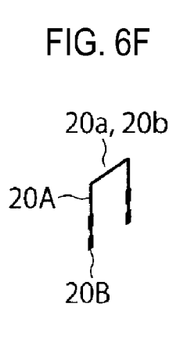

The release prevention members 20B of the valley portion support pin 20a and the mountain portion support pin 20b may be formed by deforming both end portions of the U-shaped body 20A (see FIGS. 6E and 6F).

Figure 6G:
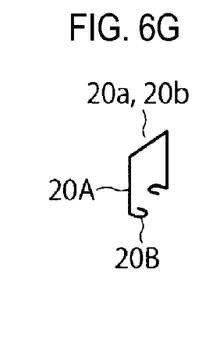

The release prevention members 20B of the valley portion support pin 20a and the mountain portion support pin 20b may be formed by bending outwardly both end portions of the U-shaped body 20A into hooks in opposite directions (see FIG. 6G).

Figure 6H:
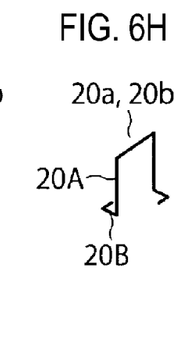

The release prevention members 20B of the valley portion support pin 20a and the mountain portion support pin 20b may be formed by bending outwardly both end portions of the U-shaped body 20A in opposite directions and then further bending both end portions of the U-shaped body 20A by 90 degrees (see FIG. 6H).

Figure 6I:
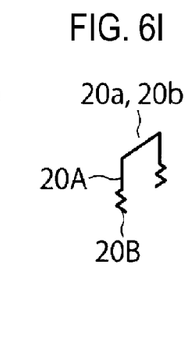

The release prevention members 20B of the valley portion support pin 20a and the mountain portion support pin 20b may be formed by bending each of both end portions of the U-shaped body 20A twice (see FIG. 6I).

Figure 6J:
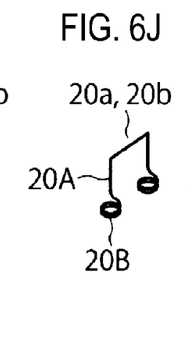

The release prevention members 20B of the valley portion support pin 20a and the mountain portion support pin 20b may be formed by winding each of both end portions of the U-shaped body 20A in a coil-shape (see FIG. 6J).

Figure 6K:
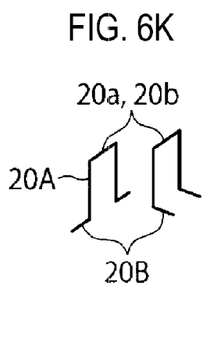

The release prevention members 20B of the valley portion support pin 20a and the mountain portion support pin 20b may be formed by bending both end portions of the U-shaped body 20A outwardly in opposite directions or in the same direction (see FIG. 6K).

Meanwhile, in order to maintain the shape of the heat insulating member 16 and reinforce the heat insulating member 16, the outer circumferential surface of the heat insulating member 16 is covered by an outer shell 28 made of metal, e.g., stainless steel, as shown in FIG. 1. Further, in order to limit a thermal effect from outside the heat treatment apparatus 1, the outer circumferential surface of the outer shell 28 is covered by a water cooling jacket 30. At the top portion of the heat insulating member 16, an upper heat insulating member 31 is provided to cover the top portion of the heat insulating member and a ceiling plate 32, e.g., made of stainless steel, is provided to cover the top portion (the upper end portion) of the outer shell 28.

In order to improve the processing speed and the throughput of the heat treatment apparatus 1 by rapidly cooling the wafer W after a heat treatment, the heat insulating member 16 is provided with a heat exhaust system 35, configured to exhaust outside the inner atmosphere of a space 33 between the heat insulating member 16 and the processing vessel 3, and a forcible cooling unit 36, configured to forcibly cool the space 33 by introducing a coolant of a normal temperature, i.e., 20 degree C. to 30 degree C., into the space 33. The heat exhaust system 35 includes, for example, a heat exhaust port 37 provided at the upper portion of the heat insulating member 16 and a heat exhaust pipe (not shown) connecting the heat exhaust port 37 and a factory exhaust system (not shown). The heat exhaust pipe may be provided with an exhaust blower (not shown) and a heat exchanger (not shown).

The forcible cooling unit 36 has a plurality of annular channels 38, formed between the heat insulating member 16 and the outer shell 28 and arranged in the vertical direction, and a plurality of coolant injection openings 40, formed in the heat insulating member 16 to inject therethrough the coolant into the space 33 in a direction inclined with respect to the radial direction of the heat insulating member 16 and thus generate a vortex flow in the circumferential direction of the space 33. The annular channels 38 are formed by attaching strip-shaped or ring-shaped thermal insulation members 41 to the outer circumferential surface of the heat insulating member 16 or by cutting off a portion of the outer circumferential surface of the heat insulating member 16 to form ring-shaped grooves thereon. In some embodiments, the coolant Injection openings 40 may be formed between vertically adjacent heater elements 18 to pass through the heat insulating member 16 in such a manner that the inside and the outside of the heat insulating member 16 in the radial direction communicate with each other. By forming the coolant injection openings 40 between the heater elements 18 as mentioned above, the coolant can be injected into the space 33 without interfering with the heater elements 18.

On the outer circumferential surface of the outer shell 28, a common supply duct 49 configured to distribute the coolant to the annular channels 38 is provided along the vertical direction. Communication openings communicating the inside of the supply duct 49 and the annular channels 38 are formed in the outer shell 28, and a coolant supply source (not shown), e.g., an air blower, configured to absorb and pressure-feed the coolant, e.g., an air or a nitrogen gas, is connected to the supply duct 49 via an opening/closing valve.

At both end portions of the heater elements 18 spirally disposed along the inner circumferential surface 16a of the heat insulating member 16, terminals 22a and 22b are provided. The terminals 22a and 22b pass through the heat insulating member 16, the outer shell 28 and the water cooling jacket 30, and are elongated outwardly.

In the space 33 between the heat insulating member 16 and the processing vessel 3, one or more temperature sensors 50 are provided, and signals from the temperature sensors 50 are transmitted to a controller 51. The controller 51 operates an electric power supply (not shown) based on the signals received from the temperature sensors 50 and controls the inner temperature of the space 33 by supplying a necessary electric power from the electric power supply to the heater elements 18.

Figure 7:
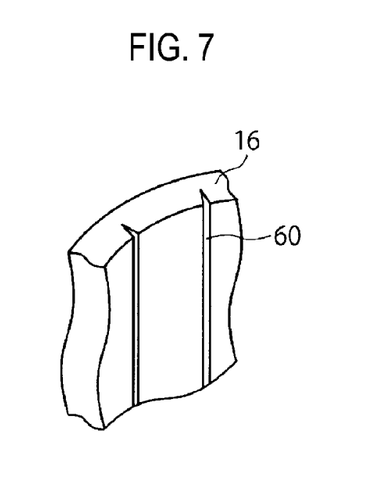
FIG. 7 illustrates a heat insulating member having slits formed thereon.

Meanwhile, as shown in FIG. 7, a plurality of slits 60 extending in the vertical direction of the heat insulating member 16 is formed on the inner circumferential surface 16a of the heat insulating member 16. With this configuration, even though the heat insulating member 16 thermally expands or contracts during heating or cooling operations, an excessive force acting on the heat insulating member 16 can be prevented, because the slits 60 can absorb the thermal expansion or contraction acting on the heat insulating member 16.

Here, the vertical direction of the heat insulating member 16 coincides with an axial direction of the cylindrical heat insulating member 16, and the horizontal direction of the heat insulating member 16 coincides with a direction perpendicular to the axial direction of the heat insulating member 16.

Figure 8:
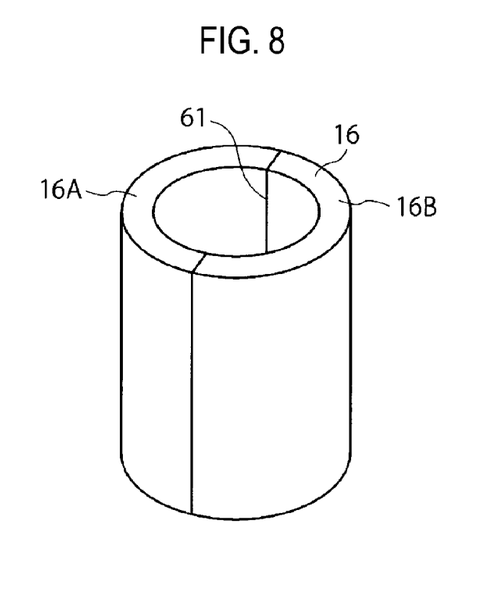
FIG. 8 illustrates a vertically half-divided heat insulating member.

Further, a configuration in which the heat insulating member 16 is vertically divided in two into a first heat insulating member 16A and a second heat insulating member 16B having a boundary surface 61 disposed therebetween, as shown in FIG. 8, may be employed. With such configuration, as shown in FIG. 8, even though the heat insulating member 16 thermally expands or contracts during heating or cooling operations, an excessive force acting on the heat insulating member 16 can be prevented, because the boundary surface 61 between the first heat insulating member 16A and the second heat insulating member 16B absorbs the thermal expansion or contraction acting on the heat insulating member 16.

Though the heat insulating member 16 is divided in two in the above example, the present disclosure is not limited thereto and the heat insulating member 16 can be divided into three, four, or any number of heat insulating members.

As described above, since the heater 5 has strip-shaped corrugated heater elements 18 spirally disposed along the inner circumferential surface 16a of the cylindrical heat insulating member 16, the heater elements 18 can be disposed on the entire inner circumferential surface 16a of the heat insulating member 16, and thus, the wafers W can be uniformly heated. Further, stress concentration during heating or cooling operations can be prevented because vertically elongated connectors do not need to be provided to the heater elements 18.

Below, a collapse prevention plate 62 will be described with reference to FIGS. 9A and 9B. In the above-described embodiment, the mountain portions 18b of the heater elements 18 are supported by the mountain portion support pins 20b. However, the present disclosure is not limited thereto, and the mountain portion 18b can be supported by the collapse prevention plate 62, instead of the mountain portion support pin 20b.

Figure 9A:
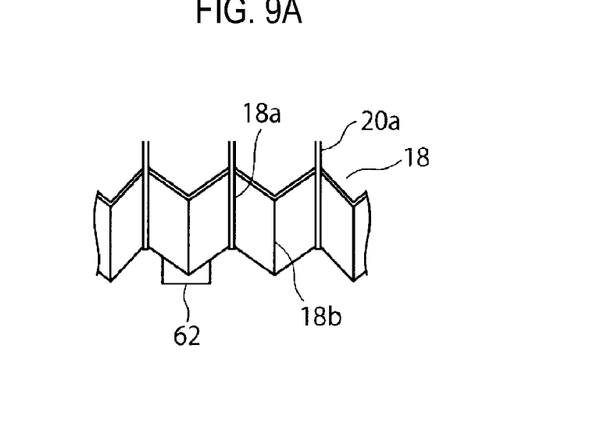
FIGS. 9A and 9B illustrate a collapse prevention plate supporting a mountain portion of a heater element.
Figure 9B:
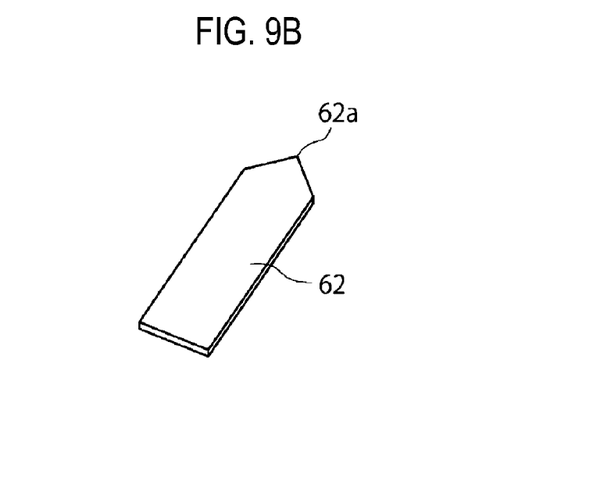

FIGS. 9A and 9B illustrate a partial perspective view and a schematic perspective view of the collapse prevention plate 62, respectively. As shown in FIG. 9A, the collapse prevention plate 62, configured to prevent the mountain portions 18b of the heater elements 18 provided on the inner circumferential surface 16a of the heat insulating member 16 from collapsing, is provided at the heat insulating member 16. The collapse prevention plate 62 is a rectangular plate, e.g., made of ceramic, and in some embodiments, an acute portion 62a configured to pierce and fix the heat insulating member 16 therewith is formed at an end portion of the collapse prevention plate 62 in the longitudinal direction. The collapse prevention plate 62 horizontally supports the lower portion of the mountain portion 18b of the heater element 18, thereby preventing the heater element 18 from collapsing or hanging down.

In the above-described embodiment, the heater elements 18 are provided on the smooth inner circumferential surface 16a of the heat insulating member 16. However, the heater elements 18 may be provided in a spiral groove formed on the inner circumferential surface 16a of the heat insulating member 16.

The present disclosure is not limited to the above-described embodiments, but various changes in design can be made within the scope of the present disclosure. For example, the processing vessel may be formed by connecting a cylindrical manifold, which is made of a heat-resistive metal, e.g., stainless steel, and has an inlet pipe portion and a gas exhaust pipe portion, to the lower end portion of the processing vessel. Further, the processing vessel may have a double-pipe structure.

According to the present disclosure, in some embodiments, the heater has the strip-shaped corrugated heater elements spirally disposed along the inner circumferential surface of the cylindrical heat insulating member. Accordingly, the heater elements can be disposed over the entire inner circumferential surface of the heat insulating member and thus the wafers can be heated uniformly. Further, since portions in the heater elements where stress is concentrated during heating or cooling operations can be removed, the overall lifespan of the heater elements can be extended.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A heat treatment furnace, comprising:
a processing vessel configured to accommodate therein at least one object to be processed;
a cylindrical heat insulating member covering a periphery of the processing vessel; and
a heater disposed along a flat inner circumferential surface of the heat insulating member having no groove,
wherein the heater includes strip-shaped corrugated heater elements spirally disposed along the flat inner circumferential surface of the heat insulating member, each of the heater elements having valley portions protruding outward and mountain portions protruding inward,
wherein the heater elements constitute a single spiral shaped member surrounding the processing vessel,
wherein the valley portions of the heater elements are supported by release prevention valley portion support pins and the mountain portions of the heater elements are supported by collapse prevention mountain portion support pins, each of the release prevention valley portion support pins including at least one release prevention member buried in the heat insulating member to prevent the prevention valley portion support pin from being released from the heat insulating member and each of the collapse prevention mountain portion support pins including at least one release prevention member buried in the heat insulating member to prevent the collapse prevention mountain portion support pin from being released from the heat insulating member, wherein the valley portions are arranged more inward compared to the flat inner circumferential surface of the heat insulating member and the mountain portions are arranged more inward compared to the valley portions, and wherein each top end portion of the valley portions and the mountain portions of the heater elements is made by a bent line, the bent line being inclined with respect to a widthwise direction of the heater elements.

2. A heat treatment apparatus, comprising:

a heat treatment furnace having a processing vessel configured to accommodate therein one or more objects to be processed, a lower end of the heat treatment furnace being open to form a vessel opening;

a lid configured to open or close the vessel opening;

a holding unit loaded on the lid and configured to mount therein the objects to be processed in multi-stages; and an elevation mechanism configured to vertically move the holding unit and the lid to open or close the vessel opening and to load or unload the holding unit into or from the processing vessel, wherein the heat treatment furnace includes:

a cylindrical heat insulating member covering a periphery of the processing vessel; and a heater disposed along a flat inner circumferential surface of the heat insulating member having no groove, wherein the heater includes strip-shaped corrugated heater elements spirally disposed along the flat inner circumferential surface of the heat insulating member, each of the heater elements having valley portions protruding outward and mountain portions protruding inward, wherein the heater elements constitute a single spiral shaped member surrounding the processing vessel, wherein the valley portions of the heater elements are supported by release prevention valley portion support pins and the mountain portions of the heater elements are supported by collapse prevention mountain portion support pins, each of the release prevention valley portion support pins including at least one release prevention member buried in the heat insulating member to prevent the prevention valley portion support pin from being released from the heat insulating member and each of the collapse prevention mountain portion support pins including at least one release prevention member buried in the heat insulating member to prevent the collapse prevention mountain portion support pin from being released from the heat insulating member, wherein the valley portions are arranged more inward compared to the flat inner circumferential surface of the heat insulating member and the mountain portions are arranged more inward compared to the valley portions, and wherein each top end portion of the valley portions and the mountain portions of the heater elements is made by a bent line, the bent line being inclined with respect to a widthwise direction of the heater elements.

\* \* \* \* \*